United States Patent [19]
Knecht

[11] Patent Number: 5,500,628
[45] Date of Patent: Mar. 19, 1996

[54] DOUBLE-SIDED OSCILLATOR PACKAGE AND METHOD OF COUPLING COMPONENTS THERETO

[75] Inventor: Thomas Knecht, Algonquin, Ill.

[73] Assignee: Motorola, Inc., Schaumburg, Ill.

[21] Appl. No.: 378,135

[22] Filed: Jan. 24, 1995

[51] Int. Cl.⁶ .............................. H03B 5/04; H03B 5/36; H01L 41/053; H05K 7/02
[52] U.S. Cl. ........................ 331/68; 331/158; 331/176; 310/348; 361/728; 361/746; 361/820
[58] Field of Search ........................... 331/67–70, 116 R, 331/116 FE, 158, 176; 310/311, 348; 361/752, 753, 757, 820, 728, 746, 747

[56] References Cited

U.S. PATENT DOCUMENTS

| | | | |
|---|---|---|---|
| 4,420,652 | 12/1983 | Ikeno | 331/158 X |
| 4,574,255 | 3/1986 | Fujii et al. | 331/158 X |
| 4,609,883 | 9/1986 | Mizumura et al. | 331/96 |
| 5,405,476 | 4/1995 | Knecht | 310/348 X |

*Primary Examiner*—David Mis
*Attorney, Agent, or Firm*—Gary J. Cunningham

[57] ABSTRACT

A double-sided oscillator package (200) is provided. The package (200) has an open-top receptacle (212) adapted to receive an electronic component and an open-bottom receptacle (214) adapted to receive at least a piezoelectric element and a cover, forming a hermetic environment. The electronic component (226) and piezoelectric element (234), can be suitably connected to the package (200). The package (200) is designed to be mass-producable, and is compact, easily surface mounted and provides a narrow profile.

18 Claims, 5 Drawing Sheets

100

DOUBLE-SIDED OSCILLATOR PACKAGE AND METHOD OF COUPLING COMPONENTS THERETO

FIELD OF THE INVENTION

The present invention relates generally to frequency control devices and, in particular, to a double-sided oscillator package and method of coupling components thereto.

DETAILED DESCRIPTION OF THE PREFERRED EMBODIMENT

The present invention provides an improved double-sided temperature compensated crystal oscillator (TCXO) package 100. This package 100 includes generally a compensation circuit, having temperature-sensitive components, coupled to a substrate. The package 100 is adapted to receive a piezoelectric element mounted onto a portion of the package 100, such that an electrical connection is provided between the compensation circuit and the piezoelectric element to produce an untuned frequency controlled device. After frequency tuning, a hermetic seal is provided around the piezoelectric element. With the package 100 of this invention, the dimensional limitations of the prior art frequency control devices are substantially overcome.

Figure 1:
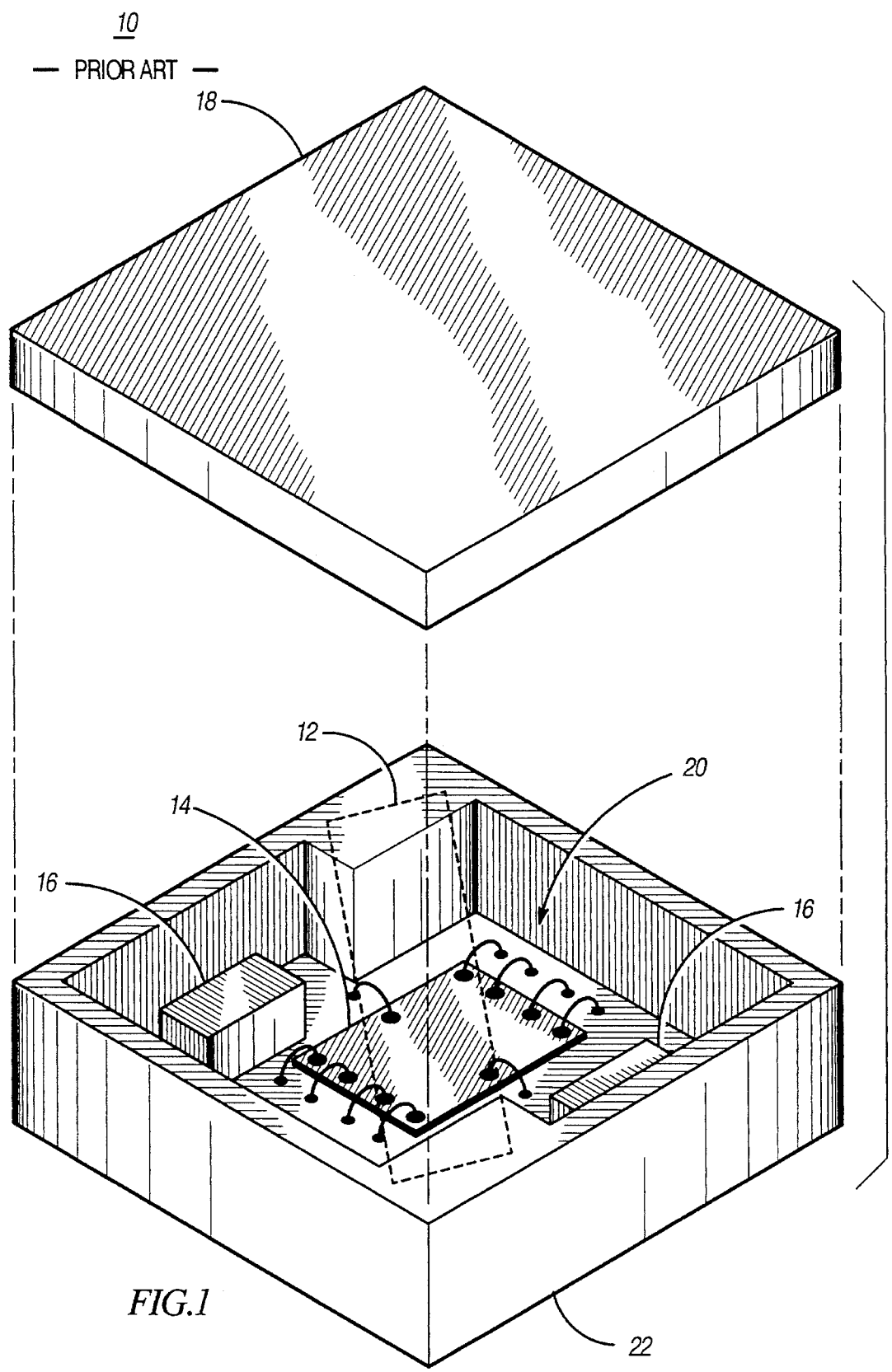
FIG. 1 is a perspective view of a prior art TCXO.
Figure 2:
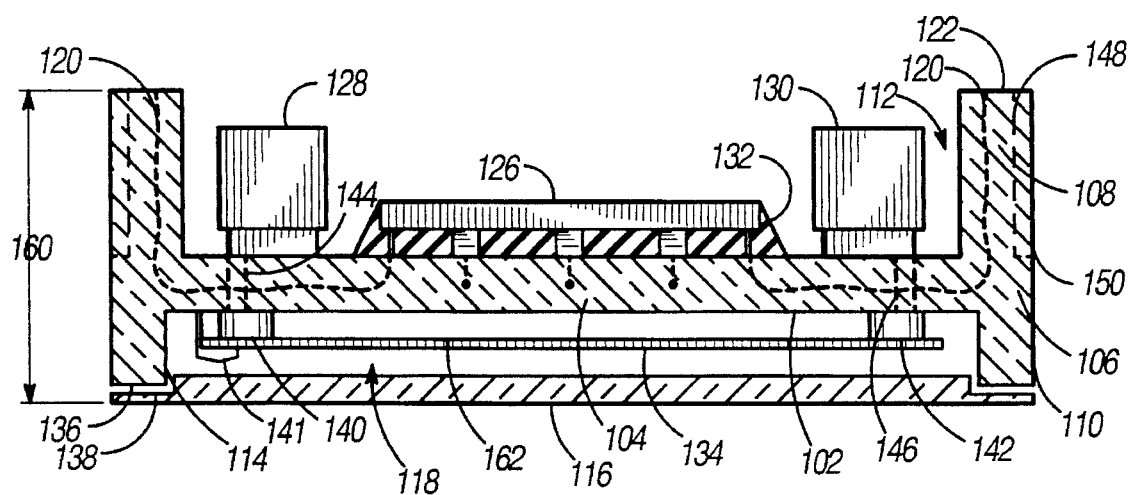
FIG. 2 shows an enlarged cross-sectional view of a double-sided temperature compensated crystal oscillator package, in accordance with the present invention.

The present invention can be more fully described with reference to FIGS. 2–4. FIG. 2 shows the package 100 in its simplest form. The package 100 includes a substantially planar platform 102 including a central portion 104, and an outer portion 106. Extending substantially upwardly and downwardly from the outer portion 106 of the platform 102, are upper and lower sidewalls 108 and 110. The upper sidewall 108 and the platform 102 form a substantially rectangular, open top receptacle 112 adapted to receive electronic components. Similarly, the lower sidewall 110 and the platform 102 form an open-bottom receptacle 114 adapted to receive at least one piezoelectric component, such as a piezoelectric element 134. A cover 116 is attached to the open-bottom receptacle 114 to provide a hermetic environment 118 defined by the open-bottom receptacle 114 and cover 116. The platform 102 helps to isolate the receptacles 112 and 114 and components therein, thereby: minimizing the possibility of contamination after assembly or during tuning; and providing a hermetically sealed piezoelectric device 134 which can be processed separately from the electronic components in the open-top receptacle 112, without sacrificing size, integrity or cost. Only one cover 116 is required to achieve this.

The package 100 geometry can vary widely. In one embodiment, the package 100 is substantially portable and rectangular or square, and is adapted for placement in an electronic device taking up an extremely small volume of the overall volume of the electronic device.

The package 100 is particularly adapted for mass production and miniaturization. For example, the package can have the dimensions of 7.11 mm×6.22 mm×2.24 mm, identified as the length, width and height 156, 158 and 160 in FIGS. 2 and 4.

In a preferred embodiment, the package 100 comprises materials having substantially similar thermal expansion coefficients, to minimize stresses within the package. In one embodiment, the open-top receptacle 112 comprises the platform 102 and the upper sidewalls 108 both made of a co-fired ceramic material, such as alumina. The lower sidewall 110 can comprise an alloy of nickel, iron and cobalt, Kovar, or Alloy 42, and the like, preferably Kovar because of its coefficient of thermal expansion being substantially similar to the ceramic material making the platform 102 and open-top receptacle 112.

A plurality of internal leads 120 (shown as dashed lines in FIG. 2) are included for coupling the electrical components and piezoelectric element 134 to electrical signals for actuating the components in package 100. Referring to FIGS. 2 and 3, the plurality of leads 120 are coupled to a plurality of respective contacts 124, positioned on an upper-end portion 122. Preferably, the upper-end portion 122 is substantially planar for providing a good contact to a circuit board to which it will be connected. The internal leads 120 are formed in the platform 102 and upper sidewalls 108. Thus, the plurality of conductive leads or paths 120 extend from the central portion 104 to the upper-end portion 122, with each lead being insulated from its adjacent lead. The leads 120 provide electrical paths from the circuitry to the end portion 122, and include cofired vias within the ceramic itself, or can include plated half holes, called castellations on the outside of the upper side walls 108.

The open-top receptacle 112 holds electronic components and the open-bottom receptacle 114 holds at least a piezoelectric element 134. More particularly, the open-top receptacle 112 holds a temperature compensation integrated circuit (IC) 126 and chip capacitors 128 and 130, securely coupled to the central portion 104 of the platform 102. The IC 126 can include any suitable IC, for example, a wire bonded IC including a glob top, a flip chip IC including an organic underfill or the like. In a preferred embodiment, the IC 126 is a flip chip IC including an organic underfill 132 for a secure coupling of the IC 126 to the central portion 104 of the platform 102 and for minimizing contamination to the IC 126.

The IC 126 is solder reflowed onto a metallized portion in proximity to the central portion 104 of the platform. This forms the electrical and mechanical connection of the IC 126 and platform 102.

The open-top receptacle 112 also includes sufficient space for conductive pads 152 and 154 adapted for tuning the piezoelectric element 134, and first and second chip capacitors 128 and 130 which typically function as DC voltage bypass capacitors. The IC 126 itself supplies the temperature compensation function.

The open-bottom receptacle 114 holds at least the piezoelectric element 134 and can include other components if desired. The piezoelectric element 134 can vary widely. Examples can include quartz, AT-cut quartz strip and the like. In a preferred embodiment, the piezoelectric element 134 comprises an AT-cut quartz strip for a well-behaved frequency versus temperature relationship from about −40° C. to about 90° C., that is temperature compensatible. Having the piezoelectric element 134 isolated from the other components minimizes the possibility of contaminating the piezoelectric element 134, resulting in undesirably altering its frequency.

More particularly, isolating and physically separating the piezoelectric element 134 in the open-bottom receptacle 112 from the components in the open-top receptacle 112, substantially minimizes the possibility of the solder, organic underfill, and other unwanted contaminants from adversely affecting the output frequency of the piezoelectric element 134, which can occur over time in prior art TCXO's.

The cover 116 is complimentary configured to be received and coupled to the open-bottom receptacle 114, and specifically to a lower-end portion 136. The cover 116 can be seam welded or solder sealed to the lower sidewalls 110, and preferably to the lower-end portion 136 for providing a good hermetic seal.

More particularly, the lower end portion 136 and an outer periphery 138 of cover 116 are complimentary configured to provide a secure interconnection and seal of the contents in the open-bottom receptacle 114 and environment 118. In one embodiment, the cover 116 is metal and coupled to a ground portion of the IC 126.

Figure 4:
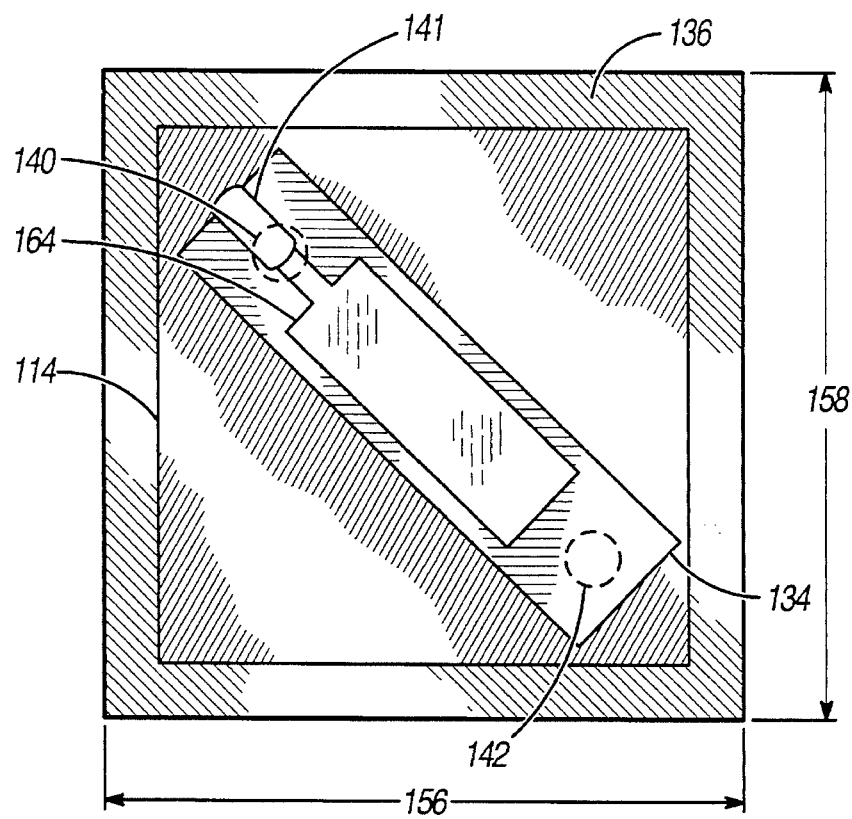
FIG. 4 shows an enlarged bottom view of the double-sided oscillator package of FIG. 2, in accordance with the present invention.
Figure 7:
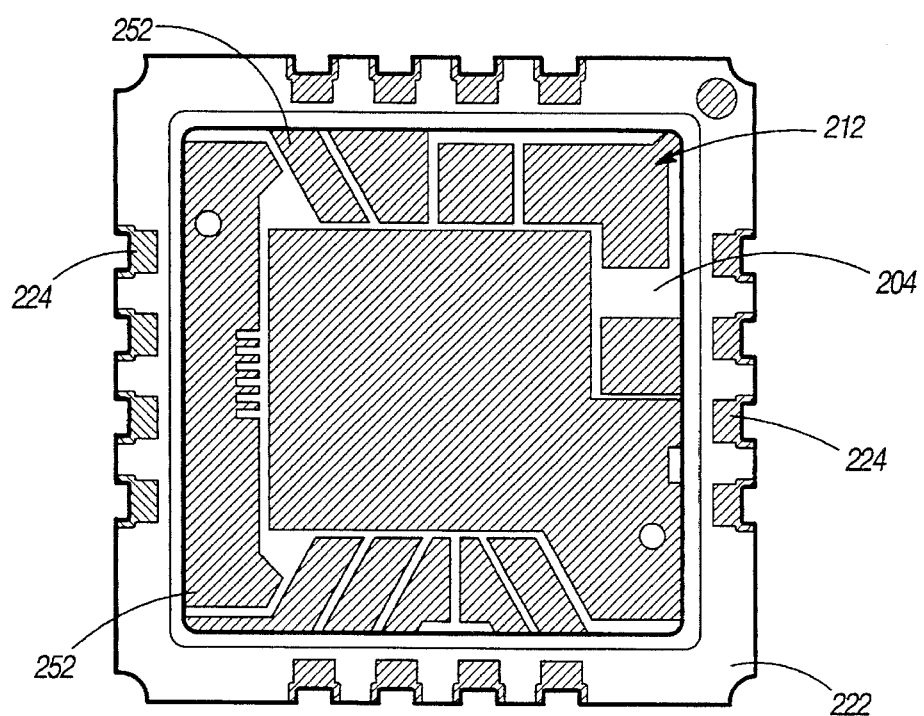
FIG. 7 shows an enlarged top view before placement of an integrated circuit (IC), of the double-sided oscillator package in FIG. 5, in accordance with the present invention.

Referring to FIGS. 2 and 4, the piezoelectric element 134 is positioned on and coupled to couplings 140 and 142. The couplings 140 and 142 provide mechanical and electrical connections to the piezoelectric element 134. Electrically connected to the couplings 140 and 142 are leads 144 and 146, preferably in the form of tungsten filled vias, for connecting the piezoelectric element 134 to the circuitry in the open-top receptacle 112 and exterior circuitry, and specifically the IC 126 and capacitors 128 and 130. The coupling 140 includes a wraparound section 141 electrically connecting an outwardly facing electrode 164 (top electrode) of the piezoelectric element 134 with lead 144. Similarly, the coupling 142 electrically connects an inwardly facing electrode 162 (bottom electrode facing the platform 102) with lead 146 in FIG. 2.

Once the TCXO package 100 has been assembled, the package 100 is suitably coupled to a circuit board for use in an electronic device. The planar end portion 122 is configured to facilitate placement on a circuit board or suitable substrate. The plurality of contacts 124 are suitably connected to respective leads 120, and to metallized paths on a circuit board for connection to an electrical device. Adjacent and perpendicular to the plurality of contacts 124, are respective grooves or castellations 148 on an exterior portion 150 of the upper sidewalls 108. Preferably, these castellations 148 are semicircular for easy inspection of the electrical connections (typically solder) between the contacts 124 to a circuit board.

The instant invention also includes a method to simplify the coupling of components to packages for use in making oscillators, and is particularly adapted to facilitating mass production of temperature compensated crystal oscillators.

In its simplest form, the instant method of coupling components to a double-sided oscillator package, comprises the steps of: providing a package 100 having an open-bottom receptacle 114; mounting and hermetically sealing a piezoelectric element 134 in the open-bottom receptacle 114; and coupling electronic components to the package.

This method and structure provides an isolation means for minimizing cross-contamination of the components on each side of the package 100. More particularly, the package 100 is configured to substantially minimize contamination from the electronic components in the open-top receptacle 112, such as the IC 126 and capacitors 128 and 130 and associated solder and flux, etc. from the piezoelectric element 134 in the open-bottom receptacle 114. If contamination occurs, the frequency stability of the piezoelectric element 134 can be adversely effected.

Another advantage of the package 100 and method is that during the process of tuning, typically additional metallization is added to the outwardly facing electrode 164 of the piezoelectric element 134. The possibility of unwanted metal contacting and adversely effecting the components in the open-top receptacle 112 is minimized, because these components are isolated on the other side of platform 102 and typically, have not even been coupled to the package 100 until the tuning step has been completed.

In a preferred embodiment, the method involves: providing a package 100 having an open-top receptacle 112 and an open-bottom receptacle 114; mounting a piezoelectric element 134 in the open-bottom receptacle 114; frequency tuning the piezoelectric element 134; hermetically sealing the piezoelectric element 134 in the open-bottom receptacle 114; and coupling electronic components to the open-top receptacle 112.

Advantageously, the open-top receptacle 112 includes accessible conductive paths 152 and 154 for actuating the piezoelectric element 134 during the frequency tuning step, whereby metal is added to the outwardly facing electrode 164, for example, before hermetically sealing in the open-bottom receptacle 114. The package 100 construction minimizes the possibility of contamination to the IC 126, chip capacitors 128 and 130, and pads 152 and 154 during tuning, since these components are substantially isolated from the piezoelectric element 134 by platform 102 and sidewalls 108 and 110.

In a preferred embodiment, the method relating to make the package 100 in FIGS. 1–4, includes the following: 1) A double-sided TCXO package 100 is provided. The package 100 includes a multi-layer ceramic portion defining the upper sidewalls 108 and a metal brazed ring defining the lower sidewalls 110, coupled to the platform 102. 2) A quartz crystal is placed in the open-bottom receptacle 114 when the package is facing upwardly and is suitably attached to the central portion 104. 3) The quartz crystal is frequency tuned by mass loading of the crystal, while actuating the quartz crystal through the metal pads 152 and 154 on the other side, accessible to the open-top receptacle 112 in the central portion 104 of the package 100. 4) The crystal is then hermetically sealed with a metal cover 116 by utilizing a parallel seam weld to couple the lower-edge portion 136 of the lower sidewalls 110 with the cover 116. The crystal portion of the fabrication process is now complete. 5) The electronic components are placed in the open-top receptacle 112 and suitably attached by dispensing solder on the platform 102 for coupling the chip capacitors 128 and 130. The solder is tacky and suitably holds the components until reflow. Next, flux is dispensed in proximity to and under the IC 126 area. A flip-chip IC with solder bumps is aligned and placed in the central portion 104 of the platform 102. The parts are then solder reflowed. And organic underfill is dispensed such that it flows underneath the IC 126 and substantially environmentally protects the IC 126. 6) Thereafter, the TCXO package 100 is sent for final electrical set up and testing. Thereafter, a customer will typically solder reflow the planar portion 122 to a circuit board suitably connecting each of the contacts 124 to a suitable electrical connection for use in electronic equipment. This method can simplify mounting and assembly of components.

Referring to FIGS. 5–8, an alternate double sided temperature compensated crystal oscillator package 200 is shown. The package 200 includes a substantially planar platform 202 including a central portion 204, and an outer portion 206. Extending substantially upwardly and downwardly from the outer portion 206, are upper and lower sidewalls 208 and 210, respectively. The upper sidewall 208 and the platform 202 form a substantially rectangular, open-top receptacle 212 adapted to receive at least one electronic component. Similarly, the lower sidewall 210 and the platform 202 form an open-bottom receptacle 214 adapted to receive at least one piezoelectric component, such as a piezoelectric element 234. A cover 216, preferably comprising a metal, is attached to the open-bottom receptacle 214 to provide a hermetic environment 218 defined by the open-bottom receptacle 214 and cover 216. In a preferred embodiment, a curable material 232 is dispensed in the open-top receptacle 212 to substantially cover and enclose the contents therein. The platform 202 helps to isolate the receptacles 212 and 214 and components therein, thereby minimizing the possibility of cross-contamination after assembly or during tuning, and providing a hermetic environment 218. Another advantage of this structure, is the integrity, cost benefits and narrow profile.

This configuration provides one of the smallest TCXO packages on the market, and lends itself to mass production by conveniently separating the piezoelectric element from the IC, and yet only requires one seal requiring leak testing. The chip caps are situated with the quartz blank (piezoelectric element), and generally will not impair aging (long term frequency stability). Moreover, this structure takes advantage of the space available inside a square enclosure, to put the chip capacitors appropriately. The base adhesive may be the same for the caps as the quartz crystal mount. The IC is separated from the hermetic chamber side. A so-called "glob top" epoxy, can be used to substantially protect the wire bonded IC from environmental damage. Applicant is not aware of any prior art TCXO packages which have the structure advantages detailed herein.

A plurality of internal leads 220 (shown as dashed lines in FIG. 5) are shown for suitably coupling the electrical components and piezoelectric element to electrical signals, for actuating the components in the package 200. Thus, a plurality of leads 220 are coupled to a plurality of respective contacts 224, positioned on an upper-planar end portion 222. Preferably, the upper end portion 222 is substantially planar for providing a good contact to a circuit board to which it will be connected, for example. This structure is particularly adapted to facilitate surface mounting of the package 200 to a circuit board. The internal leads 220 are formed in the platform 202 and upper sidewalls 208. Thus, the plurality of leads or paths 220 extend from the central portion 204 to the upper-end portion 222, with each lead being insulated from its adjacent lead. The leads 220 provide electrical paths from the circuitry to the end portion 222, and can include co-fired vias within the ceramic itself, or can include plated half-holes, sometimes referred to as castellations on the outside of the upper sidewalls 208, for example.

Figure 5:
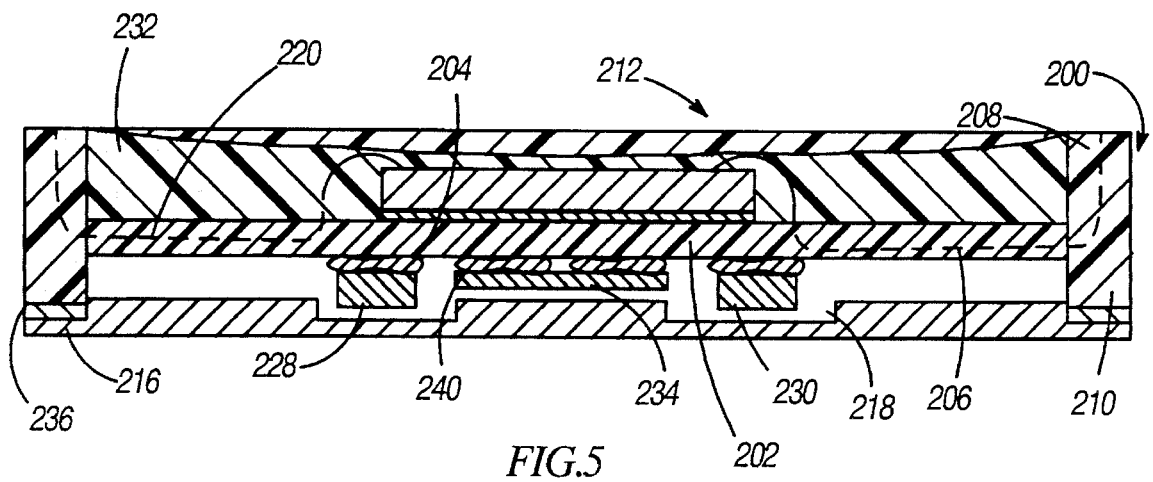
FIG. 5 shows an enlarged cross-sectional view of an alternate double-sided temperature compensated crystal oscillator package along lines 5—5 in FIG. 8, in accordance with the present invention.
Figure 8:
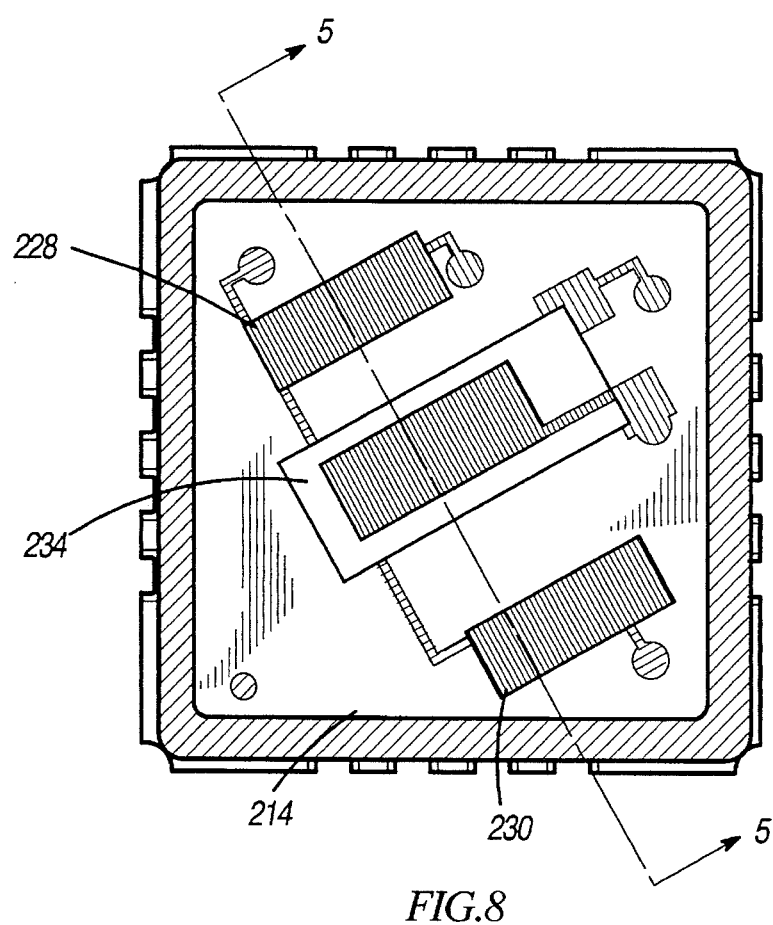
FIG. 8 shows an enlarged bottom view of the double-sided oscillator package with chip capacitors and a piezoelectric element, in accordance with the present invention.

As illustrated in FIG. 5, the open-top receptacle 212 holds at least one electronic component, and similarly, the open-bottom receptacle 214 can hold a piezoelectric element 234. More particularly, in FIG. 5 the open-top receptacle 212 holds a wire bonded temperature compensation integrated circuit (IC) 226 suitably connected to various metallizations patterns in receptacle 212, which is coupled to the central portion 204 of the platform 202. In a preferred embodiment, the open-top receptacle 212 is substantially filled with a curable material 232 thus enclosing the IC 226.

This structure is an efficient configuration from the standpoint of footprint and weight. It allows for example, one to insert the crystal and then seal up the unit so that the IC operation (placement) can be done at a later time, or even at a different location. Even though the hermetic chamber is separated from the IC, there is still only one leak check operation, because the (glob top epoxy) curable material 232 encases the IC and does not have to be leak checked.

The curable material can vary widely so long as it has a desired viscosity that will substantially homogeneously fill the open-top receptacle 212 when applied, and further when cured, it will substantially be free of bubbles and pockets, which could cause cracks and the like when in use. In a preferred embodiment, the curable material 232 includes a thermoset, organic, non-conductive material and more preferably includes a material known as Dexter Hysol 4450 which is a glob top epoxy, and can be gotten from Dexter Electronic Materials, 15051 E. Don Julian Rd., Industry, Calif. 91746.

A glob top epoxy material, provides passivation of the IC. It further provides protection from mechanical damage and is sufficiently moisture resistant to protect the electrical characteristics of the IC. Advantageously, the curable material 232 remains below the planar upper-end portion 222, so as not to interfere with the I/O pads or electrical contacts 224 during board reflow.

In a preferred embodiment, the IC 226 is silver epoxied onto a central-metallized portion in proximity to the center portion 104 of the platform 202, to form the appropriate electrical and mechanical connection. After the silver epoxy is cured, the IC can be wire bonded to the metallized areas on the ceramic substrate. These metallized pads are electrically connected to the contacts 224.

The open-top receptacle 212 also includes conductive pads, such as item 252 for connecting to contacts 224. The IC 226 supplies a temperature compensation function appropriate for a temperature compensated crystal oscillator.

The open-bottom receptacle 214 can hold various components. In a preferred embodiment, the bottom receptacle 214 holds a piezoelectric element 234 and other components, if desired. Preferably, two chip capacitors 228 and 230 are included, which typically function as DC voltage bypass capacitors. In a preferred embodiment, the piezoelectric element 134 comprises an AT-cut quartz strip, for desirable temperature compensation (TC) characteristics. Placing the piezoelectric element 134 away from the IC, can minimize the possibility of contamination to it, and cross-contamination of the components of the package 200.

Advantageously, the final tuning of the quartz crystal can be accomplished without the IC encumbering this operation. The electrical pads connected to the crystal are located on the opposite side of the crystal chamber, which is advantageous during the final tune operation.

Figure 6:
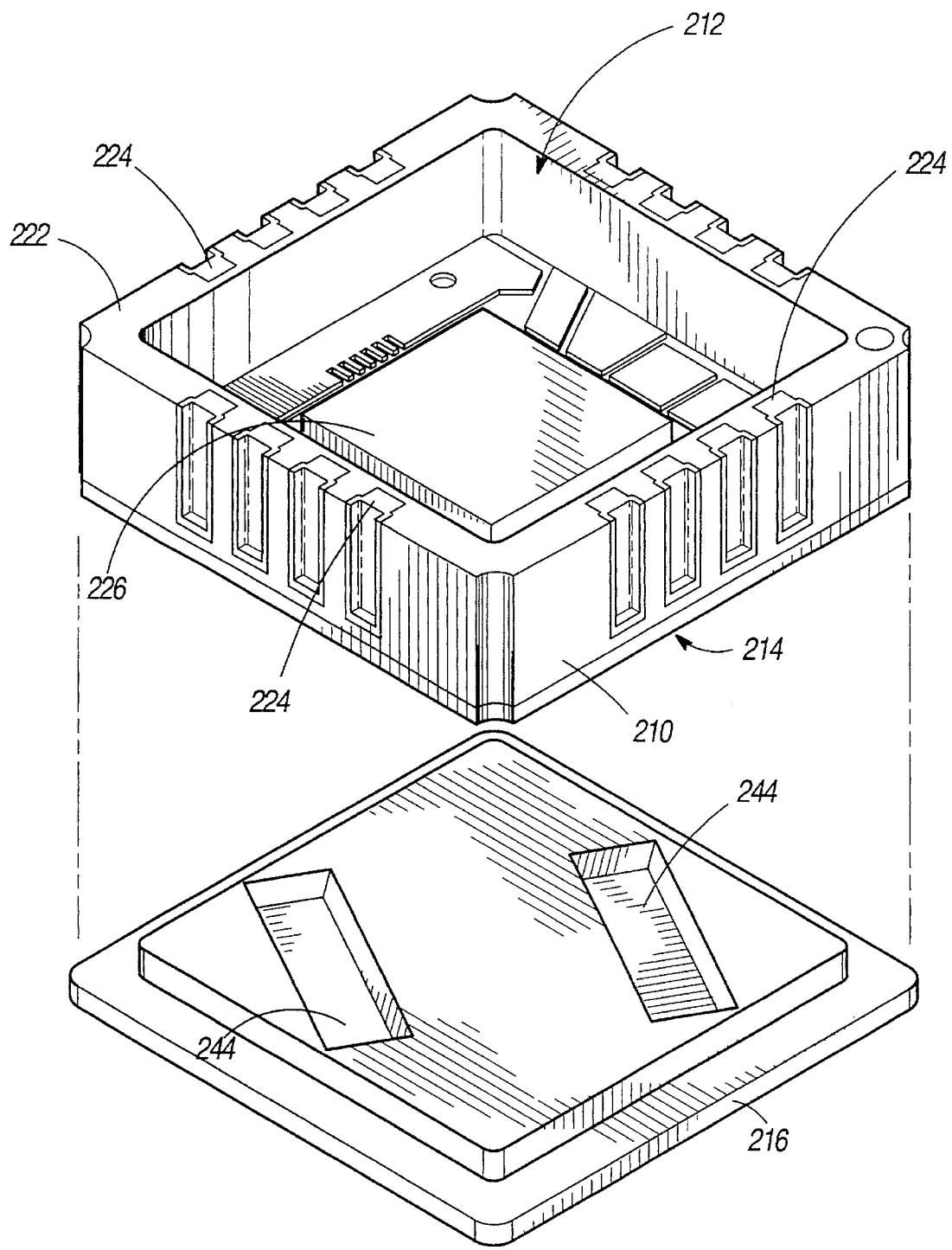
FIG. 6 shows an upper perspective view showing pockets on a cover of the double-sided oscillator package in FIG. 5, in accordance with the present invention.

As shown in FIGS. 5 and 6, the cover 216 is complimentarily configured to be received and coupled to the open-bottom receptacle 214, and specifically to a lower-end portion 236. In a preferred embodiment, the cover 216 is metal, and can be seam-welded or sodder sealed to the lower sidewalls 210, for providing a good hermetic seal. When metal, the cover 116 can be coupled to a ground portion of the IC 226, for providing a good plane and shielding. A metal cover which is connected to the circuit ground, can improve the radio frequency (RF) shielding between the crystal during operation and RF frequencies and the printed circuit board to which the oscillator is bonded on, for example.

In one embodiment, the cover 216 includes pockets 244 for at least partially receiving the chip capacitors 228 and 230, for minimizing the profile of the overall package 200.

Referring to FIG. 5, the piezoelectric element 234 is positioned on and coupled through couplings 240 and 242, which provide mechanical and electrical connections. The couplings are a conductive compliant material, such as silver epoxy or silver-filled silicone, preferably Emerson & Cumings C990 silver epoxy for good compliance.

Figure 3:
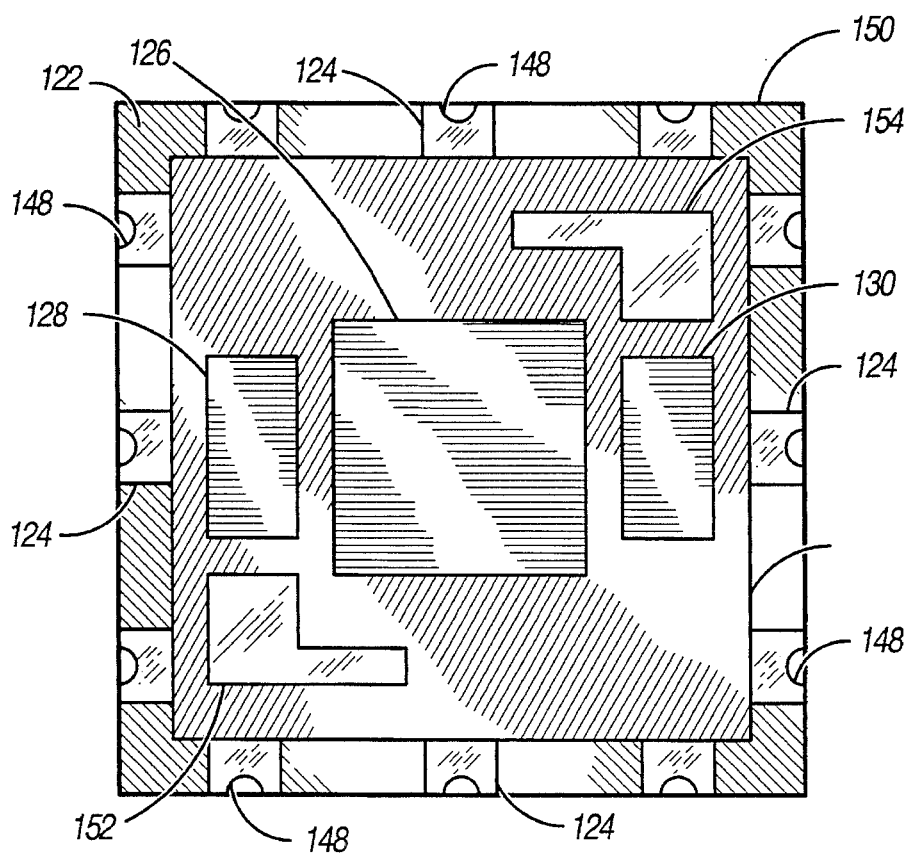
FIG. 3 shows an enlarged top view of the double-sided oscillator package of FIG. 2, in accordance with the present invention.

Much of the structure in the embodiment shown in FIGS. 5–8, is similar to the package in FIGS. 2–4. Thus, the item numbers in the first embodiment (item 100 et seq.) are similar to those in the second embodiment (items 200 et seq.) in FIGS. 5–8.

The process flow for making the package 200 in FIGS. 5–8, is similar in many respects to that of making the package 100 in FIGS. 2–4. More particularly, it generally includes the following: (1) a double-sided TCXO package as shown in the figures is provided. (2) A silver epoxy is dispensed in a central portion of the open-bottom receptacle 214. (3) The chip caps and quartz crystal are suitably placed in the open-bottom receptacle 214. (4) A silver epoxy is dispensed on a top portion of the crystal for providing a wrap around connection to a central portion 204 of the platform 202. (5) The epoxy is cured by placing the package in an oven for an appropriate period of time. (6) The quartz crystal is frequency tuned by mass loading of the crystal, while actuating the quartz crystal through the metal pads. (7) The crystal is hermetically sealed with a metal cover, by placing and sealing the metal lid with a seam weld around a periphery thereof. (8) Next, a silver epoxy is dispensed at selective positions in the open top receptacle 212. (9) The IC is suitably placed in proximity to and over the epoxy. (10) The epoxy is then cured. (11) The IC is next suitably wire bonded to the appropriate electrical connections in the central portion 204. (12) A glob top epoxy is dispensed substantially over the IC. (13) The epoxy is cured and the unit is tested.

Although the present invention has been described with reference to certain preferred embodiments, numerous modifications and variations can be made by those skilled in the art without departing from the novel spirit and scope of this invention.

What is claimed is:

1. A double-sided temperature compensated oscillator package, comprising:

a platform including a central portion and an outer portion;

sidewalls extending substantially upwardly and substantially downwardly from the outer portion of the platform, the upwardly extending sidewalls terminate at a surface mountable end portion, the surface mountable end portion includes a plurality of contacts adapted to facilitate connection to an electrical device;

the upwardly extending sidewalls and the platform forming an open-top receptacle adapted to receive at least one electronic component and the downwardly extending sidewalls and the platform forming an open-bottom receptacle adapted to receive at least one piezoelectric component; and a cover coupled with the open-bottom receptacle defining a hermetic environment.

2. The package of claim 1, wherein the open-top receptacle is adapted to receive a wire bonded integrated circuit.

3. The package of claim 1, wherein the open-top receptacle is substantially filled with a curable material and further contains a wire bonded integrated circuit therein.

4. The package of claim 1, wherein the open-bottom receptacle is adapted to receive a piezoelectric element and at least one capacitor.

5. The package of claim 4, wherein the open-bottom receptacle is adapted to receive at least two capacitors.

6. The package of claim 1, wherein the cover comprises a metal.

7. The package of claim 6, wherein the metallic cover includes at least two pockets on an inwardly facing surface, adapted to minimize the profile of the package.

8. The package of claim 7, wherein the at least two pockets are adapted and substantially in alignment with at least some of the components in the open-bottom receptacle.

9. The package of claim 1, wherein the bottom sidewalls include a ceramic portion and a metal portion.

10. The package of claim 9, wherein the metal portion includes an alloy of nickel, iron and cobalt.

11. A double-sided temperature compensated oscillator package, comprising:

a platform including a central portion and an outer portion;

sidewalls extending substantially upwardly and substantially downwardly from the outer portion of the platform;

the upwardly extending sidewalls and the platform forming an open-top receptacle and the downwardly extending sidewalls and the platform forming an open-bottom receptacle;

a cover couplable with the open-bottom receptacle defining a hermetic seal;

the open-top receptacle is adapted to receive at least one electronic component and is substantially filled with a curable material;

the open-bottom receptacle is adapted to receive a piezoelectric component; and the upwardly extending sidewalls terminating in a plurality of contacts suitably connected by leads to the at least one electronic component and the piezoelectric component, whereby a surface mountable package is defined.

12. The package of claim 11, wherein the open-bottom receptacle is adapted to receive a piezoelectric element and at least one capacitor.

13. The package of claim 12, wherein the open-bottom receptacle is adapted to receive at least two capacitors.

14. The package of claim 11, wherein the cover comprises a metal.

15. The package of claim 14, wherein the metallic cover includes at least two pockets on an inwardly facing surface, adapted to minimize the profile of the package.

16. The package of claim 15, wherein the at least two pockets are adapted for and substantially in alignment with at least some of the components in the open-bottom receptacle.

17. A method of coupling components to a double-sided oscillator package, comprising:

a) providing a package having an open-bottom receptacle and an open-top receptacle;

b) mounting and hermetically sealing a piezoelectric element in the open-bottom receptacle; and c) coupling electronic components in the open-top receptacle.

18. A method of coupling components to a double-sided oscillator package, comprising:

a) providing a ceramic package having an open-top receptacle and an open bottom receptacle;

b) mounting a piezoelectric element in the open-bottom receptacle;

c) frequency tuning the piezoelectric element;

d) hermetically sealing the piezoelectric element in the open-bottom receptacle; and e) coupling electronic components to the open top receptacle.

* * * * *